United States Patent [19]
Kawamura et al.

[11] Patent Number: 5,561,362
[45] Date of Patent: Oct. 1, 1996

[54] REMAINING CAPACITY METER AND DETECTION METHOD FOR ELECTRIC VEHICLE BATTERY

[75] Inventors: Nobuyuki Kawamura, Okazaki; Naotake Kumagai, Yokohama; Tomiji Owada; Hisamitsu Koga, both of Okazaki; Masaaki Kato, Kyoto; Nobuya Furukawa, Okazaki, all of Japan

[73] Assignee: Mitsubishi Jidosha Kogyo Kabushiki Kaisha, Toyko, Japan

[21] Appl. No.: 334,018

[22] Filed: Nov. 2, 1994

[30] Foreign Application Priority Data

Nov. 4, 1993 [JP] Japan .................................. 5-275416

[51] Int. Cl.$^6$ .............................. H02J 7/04; H02J 7/16
[52] U.S. Cl. ............................ 320/48; 320/43; 324/427
[58] Field of Search ............................. 320/31, 35, 43, 320/48; 324/426–7; 340/635, 636

[56] References Cited

U.S. PATENT DOCUMENTS

| | | | |
|---|---|---|---|
| 4,390,841 | 6/1983 | Martin et al. | 324/427 |
| 5,107,191 | 4/1992 | Lowndes et al. | 318/139 |

FOREIGN PATENT DOCUMENTS

| | | | |
|---|---|---|---|
| 5984656 | 4/1986 | Japan | B01L 3/00 |
| 61-102976 | 7/1986 | Japan | G01R 31/36 |
| 333121 | 7/1991 | Japan. | |

Primary Examiner—Peter S. Wong
Assistant Examiner—Gregory J. Toatley, Jr.

[57] ABSTRACT

A remaining capacity meter is provided for an electric vehicle battery. This meter is suited for use in the detection of a remaining capacity of the electric vehicle battery. The meter includes a full charge detection device for detecting whether the battery has been brought into a fully-charged state, a remaining capacity setting device for setting, as a full-charge-time capacity, the remaining capacity of the battery at the time of detection of the fully-charged state by the full charge detection device, a discharge/charge-based correction device for correcting the remaining capacity, which has been set by the remaining capacity setting device, while integrating, with respect to time, a current discharged from or charged into the battery, and a deterioration-based correction device for correcting the fully-charged capacity, which has been set by the remaining capacity setting device, by a deterioration-based correction quantity corresponding to the number of chargings and battery temperatures at the time of the respective chargings. A method for the detection of the remaining capacity of such an electric vehicle battery is also described.

11 Claims, 8 Drawing Sheets

FIG. I

REMAINING CAPACITY METER AND DETECTION METHOD FOR ELECTRIC VEHICLE BATTERY

BACKGROUND OF THE INVENTION a) Field of the Invention

This invention relates to a remaining capacity meter and detection method for an electric vehicle battery, which are suited for the prediction of the remaining capacity of a battery whose fully-charged capacity deteriorates at varied rates, like a nickel-base battery.

b) Description of the Related Art

In recent years, there is an ever-increasing move toward protection of the global environment. The air pollution due to the mass consumption of fossil fuels, in particular, has become a serious problem. Prevention of the air pollution is an extremely important theme for the protection of the global environment.

In automotive vehicles, engines making use of a fossil fuel such as gasoline or diesel fuel are also dominant these days. A substantial progress has been made for the purification of exhaust gas from these engines. Electric vehicles, on the other hand, are now receiving increasing attention because they do not emit exhaust gas by themselves.

At this stage electric vehicles are however still accompanied with various practical problems to be overcome. Electric vehicles have therefore not spread to the public although some electric vehicles have found utility in certain limited fields. To make electric vehicles more practical, a variety of techniques have been proposed recently with respect to electric vehicles.

As an important element of an electric vehicle, there is a battery (hereinafter called the "main battery"). The remaining capacity of the main battery is equivalent to remaining fuel, so that it is desired for a driver to be always aware of this remaining capacity.

Remaining capacity meters for electric vehicle batteries (hereinafter called the "remaining capacity meters") have therefore been developed to determine and indicate the residual capacity of such an electric vehicle battery.

Correlation is known to generally exist between the remaining capacity of a battery and the open end voltage of the battery. Devices for determining the remaining capacity of a battery by using this characteristic have also been proposed.

For example, the battery monitoring device disclosed in Japanese Utility Model Publication (Kokoku) No. HEI 3-33121 makes use of the correlation between the remaining capacity of a battery and the open end voltage of the battery. This device detects a stable open terminal voltage of the battery when the battery is not discharged, and then stores the value of the stable open terminal voltage. Upon discharge of the battery, the device stores the value of an open terminal voltage when the open terminal voltage has become stable again subsequent to end of the discharge. The stored value is updated in this manner so that the device displays the value so updated. This battery monitoring device performs the updating for the reasons to be described next.

When a battery is repeatedly discharged, the remaining capacity of the battery changes as indicated by a dashed line X in FIG. 7. As also shown in FIG. 7, the open terminal voltage of the battery, however, changes significantly as indicated by a solid line so that, although the open terminal voltage corresponds to the remaining capacity of the battery while no discharge takes place, the open terminal voltage abruptly drops upon discharge and no longer corresponds to the remaining capacity of the battery. The remaining capacity is therefore not indicated correctly if the detected value of the open terminal voltage is always shown as a quantity corresponding to the remaining capacity of the battery. For this reason, the open terminal voltage corresponding to the remaining capacity of the battery before discharge is displayed during the discharge.

The battery monitoring device is constructed as shown in FIG. 8. Shown in FIG. 8 are a battery 101, a load 102, resistors 103,104, an LED-lighting linear IC 105, a reverse-current preventing element 106, capacitors 107,110, resistors 108,111, a transistor 109, an LED 114, a voltage detection unit 115, a voltage register unit 116, a display unit 117, and a reset/correction unit 118.

At the voltage detection unit 115, an open terminal voltage of the battery 101 is divided by the resistors 103,104. A voltage obtained through the resistor 104 charges the capacitor 107 in the voltage register unit 116 so that the open end voltage of the battery 101 is stored as a voltage charged in the capacitor 107. According to the voltage so charged in the capacitor 107, the LED 114 of the display unit 117 is lit via the linear IC 105.

At the reset/correction unit 118, during use of the battery 101, no voltage appears across the resistor 111 so that the transistor 109 remains off. The capacitor is therefore not discharged by an external circuit so that, for example, a voltage A in FIG. 7 is shown at the display unit 117.

When the use of the battery 101 is interrupted, the voltage of the battery 101 arises. This rise is detected by the voltage detection unit 115 and a charging current flows into the capacitor 110 of the reset/correction unit 118. An induced voltage therefore appears between opposite ends of the resistor 111 to turn on the transistor 109. Via the resistor 108 of the reset/correction unit 118, the capacitor 107 is discharged so that the voltage of the capacitor 107 drops. At the same time, the open end voltage of the battery 101 rises and, when the voltage of the capacitor 107 has become equivalent to the open end terminal voltage of the battery 101, the discharge of the capacitor 107 stops. Then, the voltage of the capacitor 107 becomes equal to the open terminal voltage of the battery 101.

As a consequence, the voltage charged as a stored value in the capacitor 107 changes similarly to the remaining capacity X of the battery as indicated by dashed lines A→C→D→B in FIG. 7. In accordance with the voltage charged in the capacitor 107, the remaining capacity is shown at the display unit 117.

Further, a method for detecting and indicating the capacity and service life of a battery for an automotive vehicle is proposed in Japanese Patent Application Laid-Open (Kokai) No. SHO 60-245402. When either the open terminal voltage of a battery or the battery voltage during running has dropped below its predetermined value, this drop is interpreted as a decrease in the capacity of the battery and an alarm is produced. When the battery voltage has arisen beyond a predetermined charging voltage in a predetermined time while the battery is being charged for a reduction in battery load, an increase in engine speed or the like shortly after the production of the alarm, an alarm is produced to indicate that the battery is in a final stage of its service life. When the battery voltage conversely does not exceed the predetermined charging voltage within the predetermined time, an alarm is produced to indicate the need for charging. When the battery voltage has reached the predetermined charging voltage when the predetermined time has elapsed or later, the battery is indicated to be in order.

Upon charging a battery, on the other hand, it is possible to charge it to a maximum capacity, namely, a full-charge capacity by charging it for a sufficient time. As a conventional method for the determination of the remaining capacity, it is commonly practiced to add or subtract the integral, with respect to time, of a current discharged from or charged into the battery to or from its capacity at the time of full charge.

Incidentally, such an electric vehicle battery is discharged as a result of a supply of electric power to a motor. The battery is also discharged by a self-discharge and/or a dark current even while the battery is not used during stoppage of the motor. Upon determination of the remaining capacity, it is therefore necessary to take such a self-discharge and dark current into consideration.

In particular, the self-discharge is also dependent on a left-over time of the battery and the level of temperature of the battery. Devices have hence been proposed to determine the remaining capacity of a battery by predicting the quantity of a current discharged as a dark current and also estimating the quantity of a self-discharged current while taking the temperature of the battery into consideration.

Such devices include, for example, the remaining battery capacity meter disclosed in Japanese Utility Model Application Laid-Open (Kokai) No. SHO 61-102976. This remaining capacity meter predicts the capacity of the battery remaining at a given time of prediction. The prediction of the remaining capacity is performed as shown in FIG. 9.

Namely, a measurement value of a battery capacity sensor is read (step 31), a remaining capacity $C_0$ of the battery is calculated (step 32), an inputted time $Y_0$ of the measurement by the battery capacity sensor is read (step 33), and an inputted time $Y_1$ for prediction of the battery capacity is read (step 34). A dark current consumption $C_1$ is then calculated based on the time until the time $Y_1$ for prediction (i.e., $Y_1-Y_0$) (step 35).

Stored temperature data from the measurement time $Y_0$ till the prediction time $Y_1$ are then read (step 36), and stored self-discharged current data corresponding to the temperatures are read (step 37). The term "self-discharged current data" as used herein means temperature-dependent data of remaining capacity percentages as a function of the number of days during which a battery was left over as shown in FIG. 10. A self-discharged current quantity $C_2$ is calculated from such self-discharged current data (step 38). Further, the stored data of temperature at the prediction time $Y_1$ is also read (step 39) and, based on the temperature data at the prediction time $Y_1$, a change rate $C_3$ of the remaining capacity for the temperature is calculated (step 40).

Based on these calculated values $C_0$, $C_1$, $C_2$ and $C_3$, the remaining capacity $C[=(C_0-C_1)\cdot C_2\cdot C_3]$ is calculated (step 41) and is displayed (step 42).

In addition, a system for switching charging methods by taking the temperature history of a battery as an additional factor for determination is proposed in Japanese Patent Application Laid-Open (Kokai) No. HEI 4-355632.

A device is also disclosed in Japanese Patent Application Laid-Open (Kokai) No. HEI 5-276603. According to this device, the quantity of a charged or discharged current is determined from a charged or discharged current which has been detected. This charged or discharged current quantity is added to or subtracted from a value of a remaining capacity memory to determine the remaining capacity. A charging or discharged current is corrected based on a capacity reduction characteristic inherent to a battery especially when the charging or discharged current is equal to or greater than a rated current.

In general, a battery is gradually deteriorated while it is repeatedly charged and discharged so that, as a characteristic thereof, its full-charge-time capacity itself also decreases gradually. Although a battery is generally considered to deteriorate depending on the number of such charge-discharge cycles, nickel-based batteries which are employed as batteries for electric vehicles deteriorate at varied rates in such full-charge-time capacity, thereby making it difficult to accurately predict the remaining capacities of the batteries.

In the case of a nickel-based battery, this is attributed to the fact that the deterioration of the battery varies depending on its temperature. For example, FIG. 4 diagrammatically illustrates deteriorations of a chargeable nickel-cadmium battery (Ni-Cd battery), a nickel-based battery, in full-charge-time capacity as a function of the number of charge-discharge cycles for different battery temperatures. As is shown in the diagram, it is appreciated that the deterioration becomes severer as the temperature of the battery goes up.

Although the above-described conventional techniques include those determining the remaining capacity of a battery while taking the temperature of the battery into consideration, for example, like the meter disclosed in Japanese Utility Model Application Laid-Open (Kokai) No. SHO 61-102976, none of them take the number of charge-discharge cycles of the battery into additional consideration so that variations in the deterioration of the full-charge-time capacity are not specifically taken into account. It is therefore difficult to accurately predict the remaining capacity of a battery.

SUMMARY OF THE INVENTION

With the foregoing in view, the present invention has as a primary object thereof the provision of a remaining capacity meter for an electric vehicle battery, which always permits accurate prediction of the remaining capacity of the electric vehicle battery.

Another object of the present invention is to provide a remaining capacity detection method for an electric vehicle battery, which always permits accurate prediction of the remaining capacity of the electric vehicle battery.

In one aspect of the present invention, there is provided a remaining capacity meter for an electric vehicle battery, said meter being suited for use in the detection of a remaining capacity of the electric vehicle battery, comprising:

full charge detection means for detecting whether said battery has been brought into a fully-charged state;

remaining capacity setting means for setting, as a full-charge-time capacity, the remaining capacity of said battery at the time of detection of the fully-charged state by the full charge detection means;

discharge/charge-based correction means for correcting the remaining capacity, which has been set by said remaining capacity setting means, while integrating, with respect to time, a current discharged from or charged into said battery; and deterioration-based correction means for correcting the fully-charged capacity, which has been set by said remaining capacity setting means, by a deterioration-based correction quantity corresponding to the number of chargings and battery temperatures at the time of the respective chargings.

In another aspect of the present invention, there is also provided a remaining capacity detection method for an electric vehicle battery, said method being useful for the detection of a remaining capacity of said electric vehicle battery, comprising the following steps:

detecting whether said battery has been brought into a fully-charged state;

setting a full-charge-time capacity, which has been obtained by correcting an initial full-charge-time capacity of said battery by a deterioration-based correction amount corresponding to the number of chargings of said battery and the battery temperatures at the time of the respective chargings, as the remaining capacity of said battery when said battery has been brought into the fully-charged state; and correcting the remaining capacity, which has been set in the remaining capacity setting step, while integrating, with respect to time, a current discharged from or charged into said battery.

According to the remaining capacity meter and detection method of the present invention, variations in the deterioration of the full-charge-time capacity of an electric vehicle battery are taken into account, thereby making it possible to accurately predict the remaining capacity of the electric vehicle battery.

DETAILED DESCRIPTION OF THE INVENTION

The remaining capacity meter of one embodiment of the present invention for an electric vehicle battery will hereinafter be described with reference to FIGS. 1 through 6.

Figure 1:
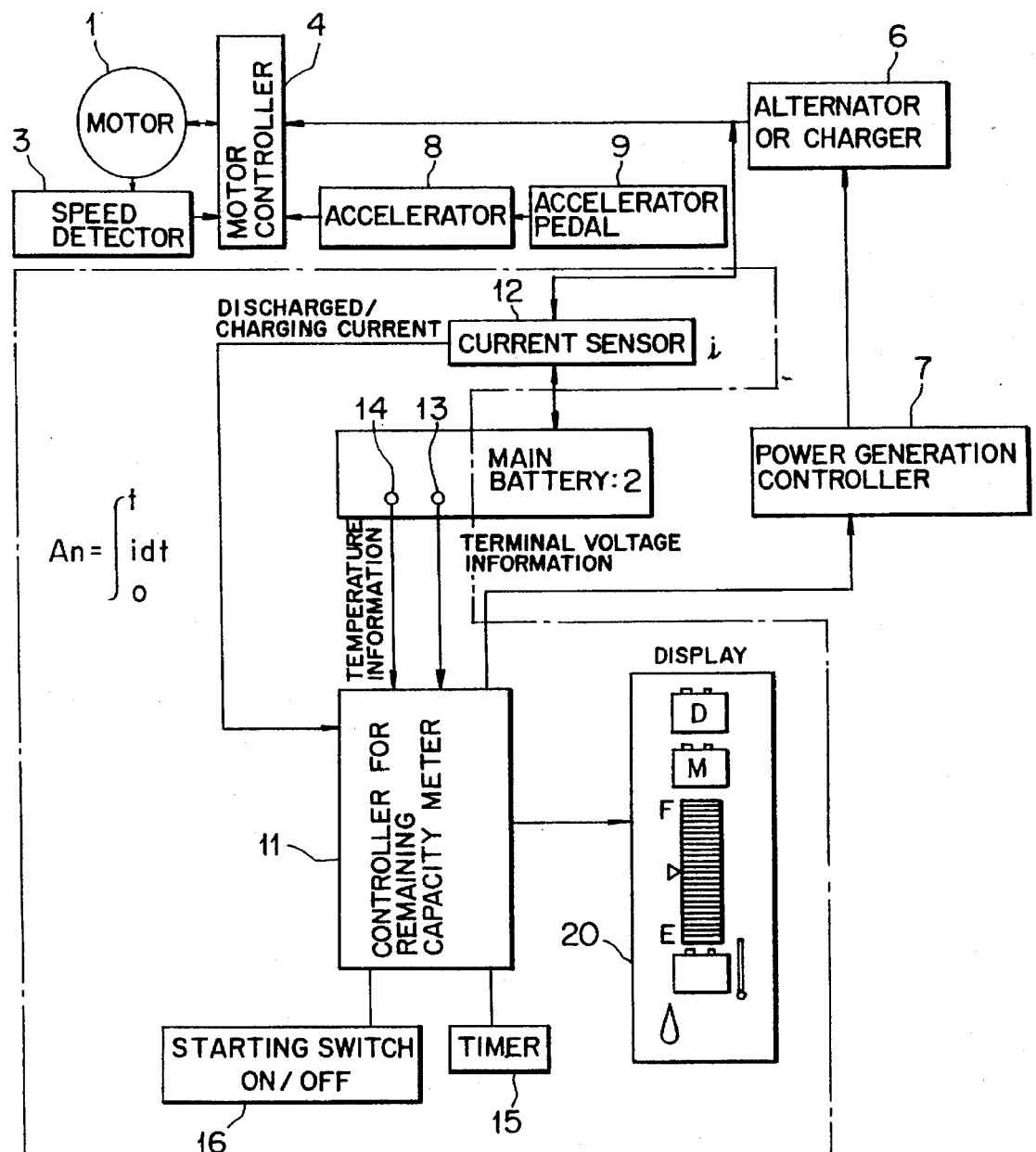
FIG. 1 is a simplified block diagram showing an electric vehicle battery (main battery) system equipped with a remaining capacity meter according to one embodiment of the present invention for the electric vehicle battery.
Figure 2:
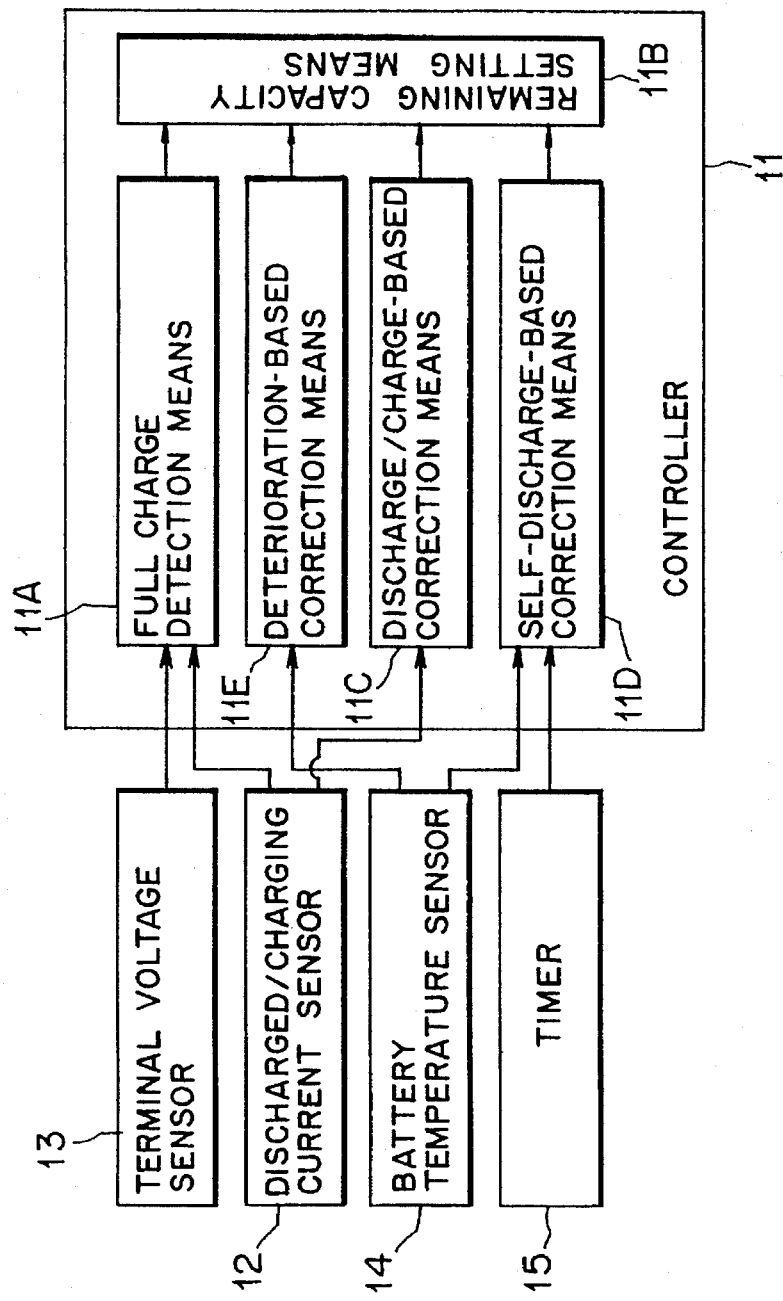
FIG. 2 is a schematic block diagram illustrating the functional construction of the remaining capacity meter according to the embodiment of the present invention for the electric vehicle battery.

The remaining capacity meter for the electric vehicle battery is arranged in such a main battery system as shown in FIG. 1. In FIGS. 1 and 2, there are shown a drive motor 1 and an electric vehicle battery (hereinafter called "the main battery") 2 mounted on a vehicle to supply electric power to the motor 1. The main battery 2 is composed, for example, of many small batteries connected in series so that a predetermined voltage is obtained. A nickel-cadmium battery is employed as the main battery 2.

Designated at numeral 4 is a motor controller, which is interposed between the main battery 2 and the motor 1. The motor controller 4 controls a current to be supplied from the main battery 2 to the motor 1, for example, on the basis of the stroke of a depression of an accelerator pedal 9, said stroke being readable via an accelerator 8, and the state of operation of the motor 1 readable at the same time by a motor speed detector 3 or the like.

Numeral 6 indicates an alternator or charger mounted on the vehicle (hereafter collectively called "the charging means"), so that the electric vehicle is constructed as a series hybrid electric vehicle. Incidentally, the alternator 6 is controlled in operation by a power generation controller 7. The charger 6 is provided with terminals through which the charger 6 can be connected, for example, to an external a.c. source of 200 V, whereby the main battery 2 can be charged subsequent to running.

The remaining capacity meter 10 arranged in such a main battery system is constructed of a controller 11 as a computing unit for calculating a remaining capacity as well as a current sensor 12, a voltage sensor 13, a temperature sensor 14, a timer 15 and a remaining capacity display unit 20 and the like, all connected to the controller 11.

Of these, the current sensor 12 is arranged in a current circuit which connects the main battery 2 to the motor controller 4 and also to the alternator or charging means 6, whereby the current sensor 12 can detect a current supplied from the main battery 2 to the motor 1 through the motor controller 4 (i.e., a discharged current) and also a current fed from the alternator or charging means 6 to the main battery 2 (i.e., a charging current). Further, the voltage sensor 13, on the other hand, is connected to terminals of the main battery 2 to measure the terminal voltage whereas the temperature sensor 14 measures the temperature of the main battery 2.

Although not illustrated in the drawings, the controller 11 is equipped with a microcomputer, an input interface, an output interface, etc. and uses the main battery 2 as its power source. When a starting switch 16 is turned on, a remaining capacity is displayed at the display unit 20.

The functional construction of the controller 11 can be illustrated as shown in FIG. 2. The controller 11 is provided with full charge detection means 11A, remaining capacity setting means 11B, discharge/charge-based correction means 11C, self-discharge-based correction means 11D, and deterioration-based correction means 11E.

From an open terminal voltage detected by the voltage sensor 13 and a charging current detected by the current sensor 12, the full charge detection means 11A determines that the main battery has been fully charged at the time point that the main battery has been charged for a predetermined time, the charging has changed to constant-voltage charging and the charging current is becoming smaller (for example, 2–3 hours in the case of a Ni-based battery).

Concurrently with a start-up, the remaining capacity setting means 11B estimates an initial value of the remaining capacity from an open terminal voltage detected by the voltage sensor 13 and then sets the same. This estimation can be performed based on a correlation between open terminal voltages of the battery and corresponding remaining capacity of the battery, both of which have been stored in advance. Upon detection of a full charge by the full charge detection means 11A, the remaining capacity setting means 11B sets, as a remaining capacity Q, a full-charge-time capacity $Q_{max}$ (in other words, sets $Q=Q_{max}$) either concurrently with the detection of the full charge or after continuing the charging for a predetermined time. Incidentally, the capacity of the battery is expressed in (=ampere-hour).

The charge/discharge-based correction means 11C corrects the remaining capacity Q, which has been set by the remaining capacity setting means 11B, while integrating, with respect to time, the current discharged from or charged into the main battery 2 while the electric vehicle is driven.

Namely, while the electric vehicle is driven, electric power is supplied to the motor 1 so that the main battery 2 is discharged. While detecting a discharged current $i_1$ by the current sensor 12 at this time, an electric capacity $Q_2$ lost by the discharging is subtracted from the remaining capacity Q to correct the latter so that the remaining capacity Q which progressively decreases in accordance with the quantity of the discharged current-can be estimated. This correction can also be expressed as shown by the following formula:

$$Q=Q-\int i_1 \, dt \qquad (1)$$

If discharging is continuing, a definite integral is calculated from the time point of the initiation of the discharging (hereinafter referred to as "the time point 0") to the current time point (hereinafter referred to, for example, as "the time point $t_1$). If discharging has ended, a definite integral is calculated from the time point of the initiation of the discharging (hereinafter referred to as "the time point 0) to the time point of the end of the discharging (hereinafter referred to, for example, as "the time point $t_2$).

In the case of this electric vehicle, the vehicle is usually driven by feeding electric power from the main battery 2 to the motor 1. In case of such a situation that the remaining capacity of the main battery 2 becomes unduly low during running, the vehicle is also equipped with the alternator 6 mounted thereon. If the remaining capacity of the main battery 2 drops below a predetermined level, the vehicle then runs while generating electric power by the alternator 6. The main battery 2 can be charged by extra electric power available during this power generation. While detecting a charging current $i_2$ by the current sensor 12 at this time, an electric capacity $Q_3$ added by the charging is added to the remaining capacity Q to correct the latter so that the remaining capacity Q which progressively increases in accordance with the quantity of the charging current can be estimated. This correction can also be expressed as shown by the following formula:

$$Q=Q+\int i_2 \, dt \qquad (2)$$

If charging is continuing, a definite integral is calculated from the time point of the initiation of the charging (hereinafter referred to as "the time point 0") to the current time point (hereinafter referred to, for example, as "the time point $t_1$). If charging has ended, a definite integral is calculated from the time point of the initiation of the charging (hereinafter referred to as "the time point 0) to the time point of the end of the charging (hereinafter referred to, for example, as "the time point $t_2$).

The self-discharge-based correction means 11D estimates a self-discharged quantity $Q_4$ of the main battery 2 while the electric vehicle remains out of operation and subtract the self-discharged quantity $Q_4$ from the remaining capacity Q to correct the latter. Since the self-discharged quantity $Q_4$ is dependent on a left-over time $t_B$ of the main battery 2 and a temperature $T_B$ of the battery, the self-discharge-based correction means 11D estimates the self-discharged quantity $Q_4$ while obtaining the left-over time $t_B$ from the timer 15 and also obtaining at appropriate intervals the temperature $T_B$ of the battery from the temperature sensor 14. Accordingly, a self-discharged quantity QQ per unit time can be expressed as a function of the temperature $T_B$, for example, as $QQ=f(T_B)$. By integrating this value $QQ=f(T_B)$, with respect to time, over the left-over time $t_B$, the self-discharged quantity $Q_4$ can be determined. By subtracting the self-discharged quantity $Q_4$, which has been determined as described above, from the remaining capacity Q to correct the latter, it is possible to estimate the remaining capacity Q which is decreasing in accordance with the self-discharged quantity.

The discharge/charge-based correction means 11C and the self-discharge-based correction means 11D have been described above in such a way that they determine correction amounts by integrating the charged quantity over the discharged time and the discharged quantity over the charged time, respectively, and then perform corrections on the basis of the correction amounts so determined. It is however to be noted that in an actual process of computation, the remaining capacity Q is determined by adding or subtracting a correction amount corresponding to each cycle of computation.

Described specifically, when the main battery 2 is discharged because of feeding of electric power to the motor 1, the remaining capacity Q is determined by subtracting, per every cycle of computation, a quantity $q_2$ which has been obtained by weighting the discharged current $i_1$ with a factor corresponding to the cycle of computation. At the time of charging, on the other hand, the remaining capacity Q is determined by adding, per every cycle of computation, a quantity $q_1$ or $q_3$ which has been obtained by weighting the charging current $i_2$ with a factor corresponding to the cycle of computation. Here, $q_1$ stands for the added quantity upon external charging while $q_3$ represents the added quantity upon internal charging. Upon self-discharging, the remaining capacity Q is determined by subtracting, per every cycle of computation, a quantity $q_4$ which has been obtained by weighting, with a factor corresponding to the cycle of computation, the self-discharged quantity estimated for the temperature $T_B$ of the battery in the cycle of computation.

If the battery temperature is high, an energy loss inside the battery upon discharging or charging becomes so great that its influence becomes no longer ignorable. It is hence necessary to set correction coefficients (temperature-based correction coefficients) $kt_1,kt_2$ with respect to the temperatures at the time of charging and discharging and to correct the values of the discharged current $i_1$ and the charging current $i_2$ in accordance with the temperature-based correction coefficients $kt_1,kt_2$, respectively. These temperature-based correction coefficients $kt_1,kt_2$ can be expressed as shown by the following formulas (3) and (4):

$$kt_1 = 1/[(1-a(t-30)] \qquad (3)$$

$$kt_2 = 1-b(t-30) \qquad (4)$$

In the above formulas (3) and (4), t represents a battery temperature detected in each control cycle. As use conditions, the battery temperature t may range from −20° C. to 60° C. (inclusive) (−20≦t≦60) upon discharging and from −20° C. to 45° C. (inclusive) (−20≦t≦45) upon charging. Further, a and b are factors. Although these factors vary depending on the characteristics of each battery, their values are, for example, approximately 0.006 and approximately 0.006 (a≈0.006, b≈0.006).

To perform such a temperature-based correction, it is only necessary to conduct the subtractive correction at the time of discharging by effecting subtraction per every cycle of control as shown by the following formula (5):

$$Q=Q-q_2 \cdot kt_1 \quad (5)$$

Figure 5:
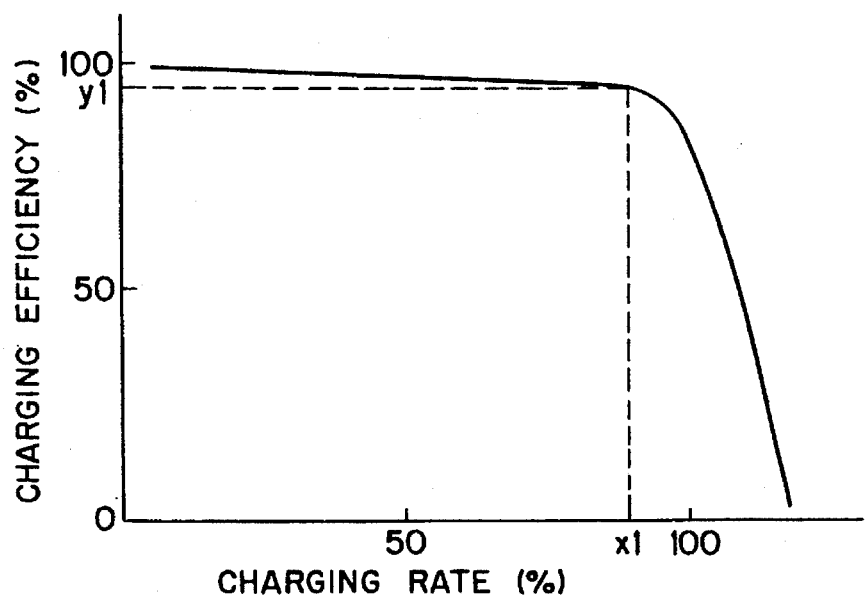
FIG. 5 is a diagram showing the charging efficiency characteristic of a battery as a function of charging rate upon charging the battery.

At the time of charging of a battery, there is, for example, such a relationship as shown in FIG. 5 between the charging rate and the charging efficiency. Up to a certain level (for example, about 80–90%) of the charging rate, a charging efficiency of approximately 100% is available. When the charging rate exceeds the above level, however, electrolysis of water contained inside the battery takes place, resulting in a reduction in the charging efficiency. It is therefore necessary to set a correction coefficient kchg with respect to the charging rate (charging-rate-based correction coefficient) and to correct the value of the charging current $i_1$ by the charging-rate-based correction coefficient. This charging-rate-based correction coefficient kchg can be expressed as shown by the following formula (6):

$$kchg=(-Ae^B(X-X_1)+Y_1)\times 10^2 \quad (6)$$

In the above formula (6), X represents the charging rate (%), which can be calculated by comparing the remaining capacity, which is obtained in each control cycle, with the fully-charged capacity. $X_1$ is the charging rate at a point of inflection where the charging efficiency suddenly begins to drop, whereas $Y_1$ is the charging coefficient at this point of inflection. These values $X_1, Y_1$ are inherent values determined by the characteristics of each battery. Further, A and B are factors.

To perform such a temperature-based correction and charging-efficiency-based correction, it is only necessary to conduct the additive correction at the time of charging by effecting addition per every cycle of control as shown by the following formulas (7) and (8):

$$Q=Q+q_1 \cdot kt_2 \cdot kchg \quad (7)$$

$$Q=Q+q_3 \cdot kt_2 \cdot kchg \quad (8)$$

Figure 6:
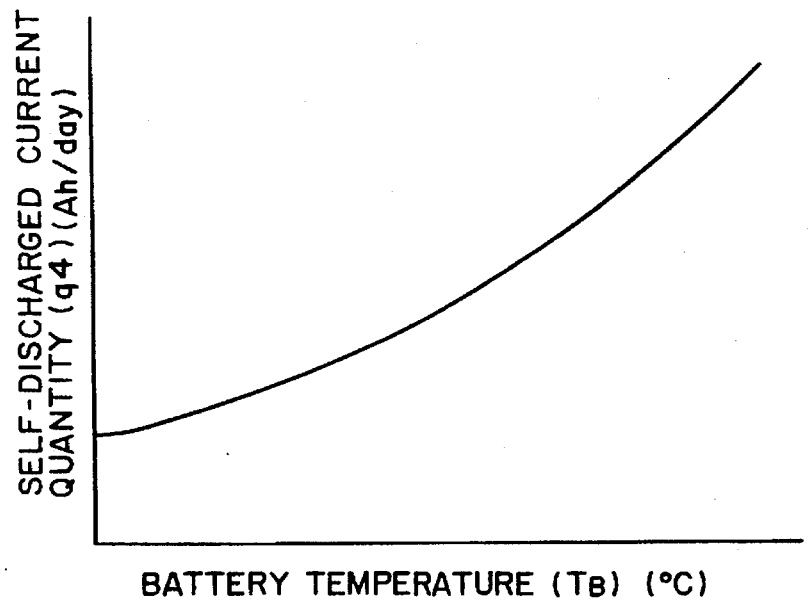
FIG. 6 is a diagram showing the self-discharge characteristic of a battery as a function of the temperature of the battery.
Figure 7:
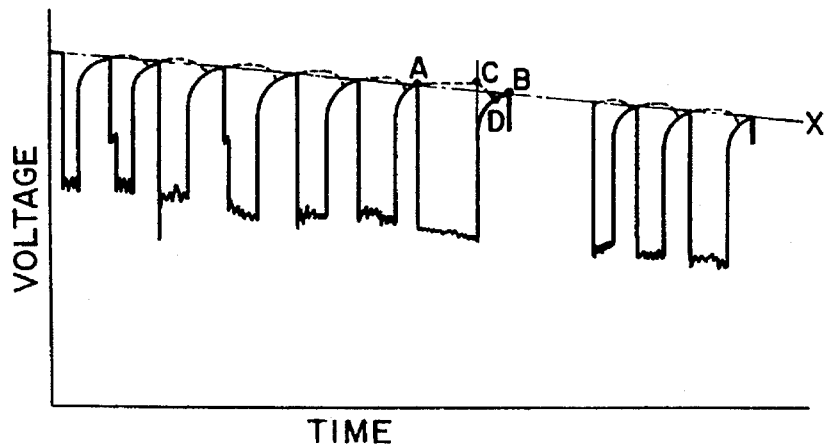
FIG. 7 is a diagram illustrating voltage characteristic of a battery for intermittent discharges and a conventional battery monitoring system.
Figure 8:
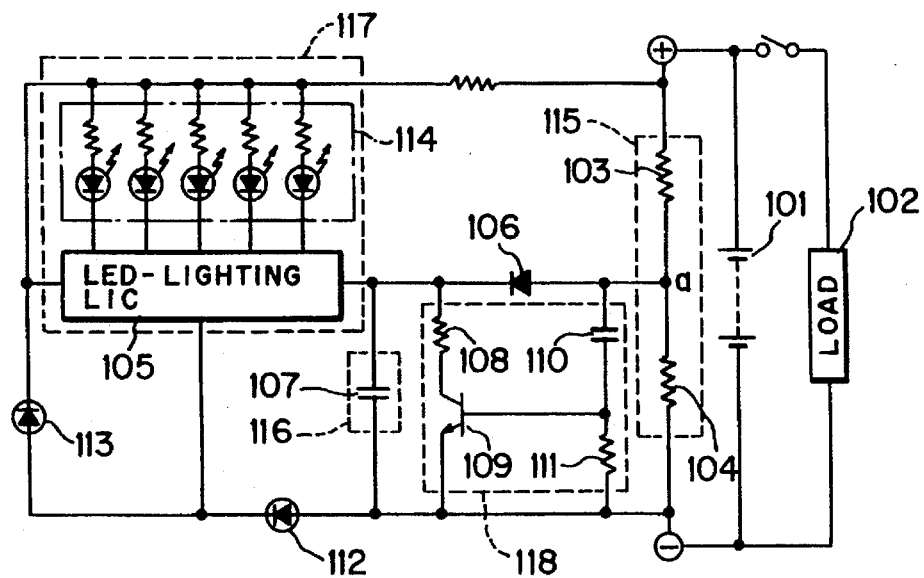
FIG. 8 is a circuit diagram illustrating the conventional battery monitoring system.
Figure 9:
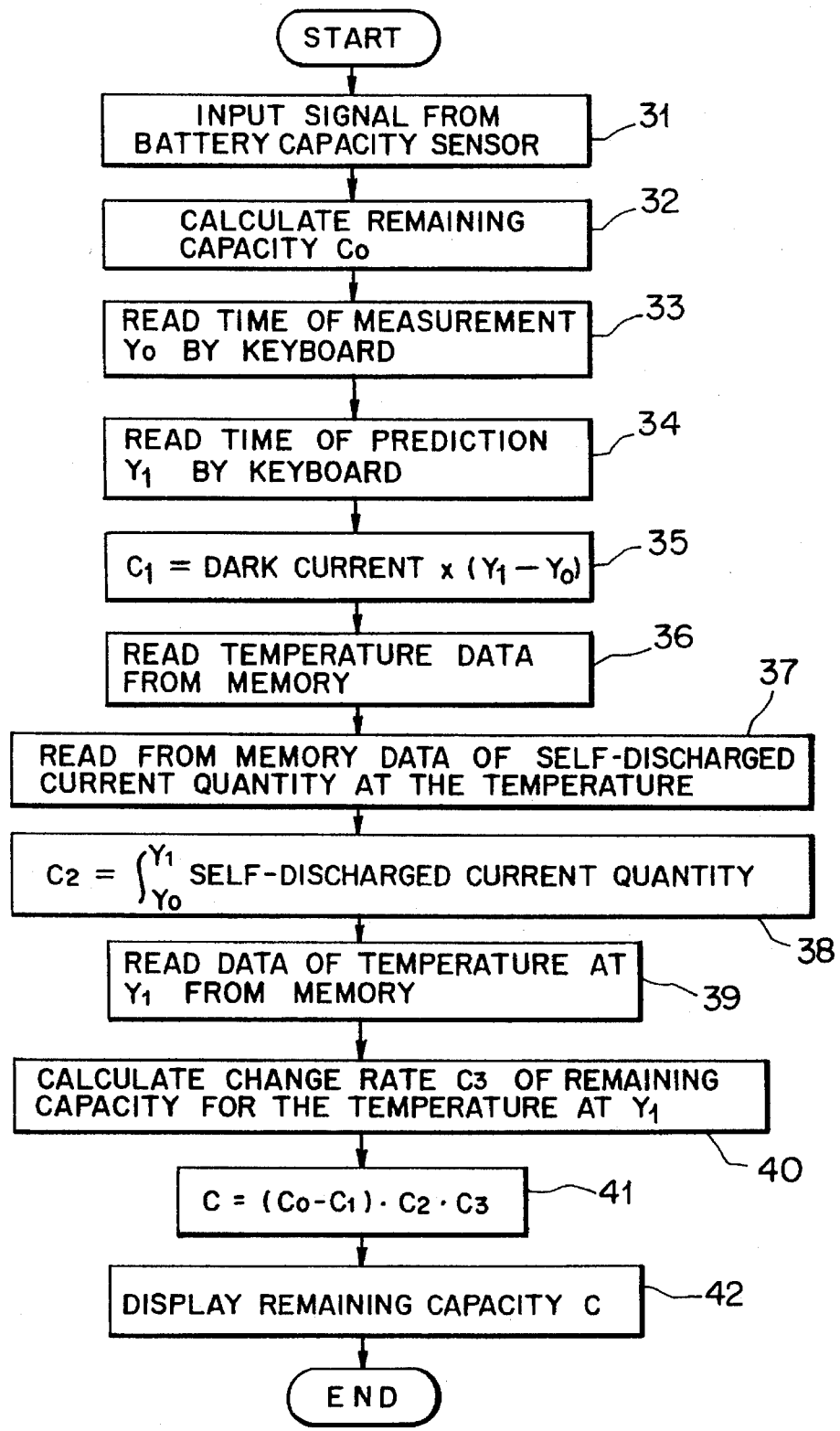
FIG. 9 is a flow chart showing procedures for the detection and display of the remaining capacity of a battery by a conventional remaining capacity meter.
Figure 10:
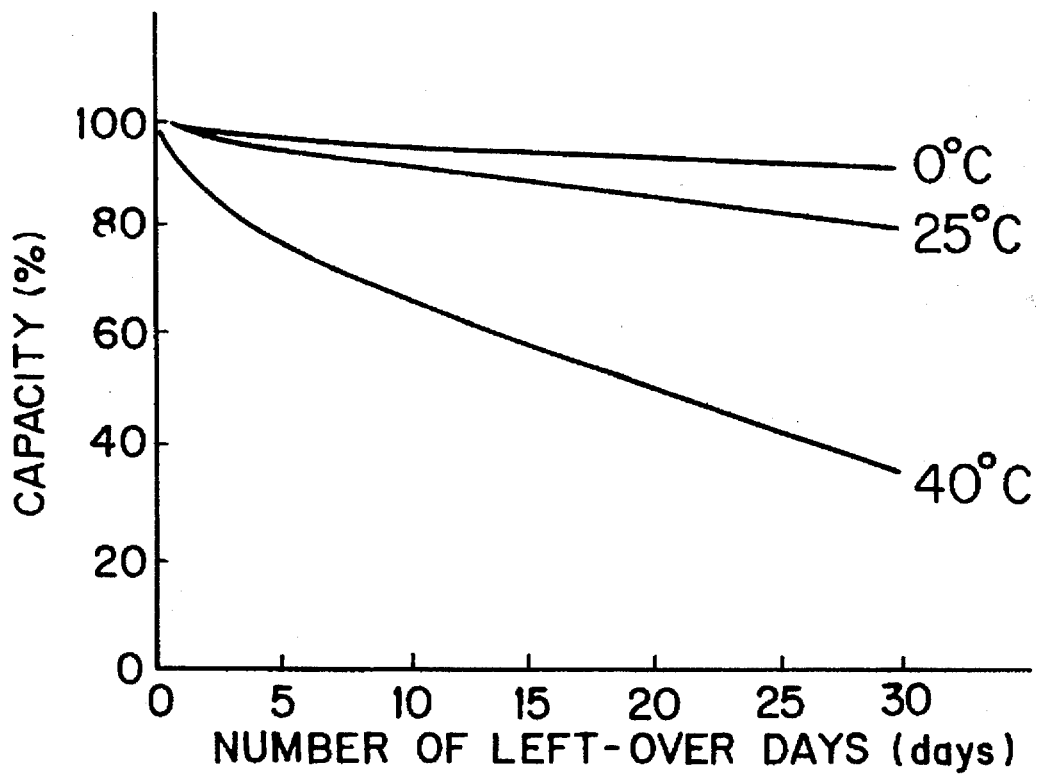
FIG. 10 is a diagram showing the self-discharge characteristic of a battery as a function of the left-over time and temperature of the battery.

With respect to the self-discharge-based correction, the self-discharged quantity QQ per unit time increases with the battery temperature $T_B$ as depicted in FIG. 6. Such self-discharging characteristics for the battery temperature $T_B$ can be represented, for example, by such a curve of the third order as shown by the following formula (9):

$$QQ=cT_B^3+dT_B^2+eT_B \quad (9)$$

In the above formula (9), the unit time is a day and $T_B$ represents a mean daily temperature calculated based on temperature data detected at appropriate intervals. Further, c, d and e are factors, for example, c≈6×10⁻⁵, d≈2×10⁻³ and e≈3×10⁻².

Accordingly, the capacity $q_4$ subtracted for correction per every cycle of computation is given, for example, by the following formula (10):

$$q_4=r(cT_B^3+dT_B^2+eT_B) \quad (10)$$

wherein r is a factor.

The basis for such an estimated value of the remaining capacity Q is the capacity $Q_{max}$ at the time of full charging as described above (i.e., $Q=Q_{max}$). This full-charge-time capacity $Q_{max}$ decreases in accordance with deterioration of the main battery 2. Accordingly, the deterioration-based correction means 11E corrects the full-charge-time capacity $Q_{max}$ in accordance with the deterioration of the battery.

Figure 4:
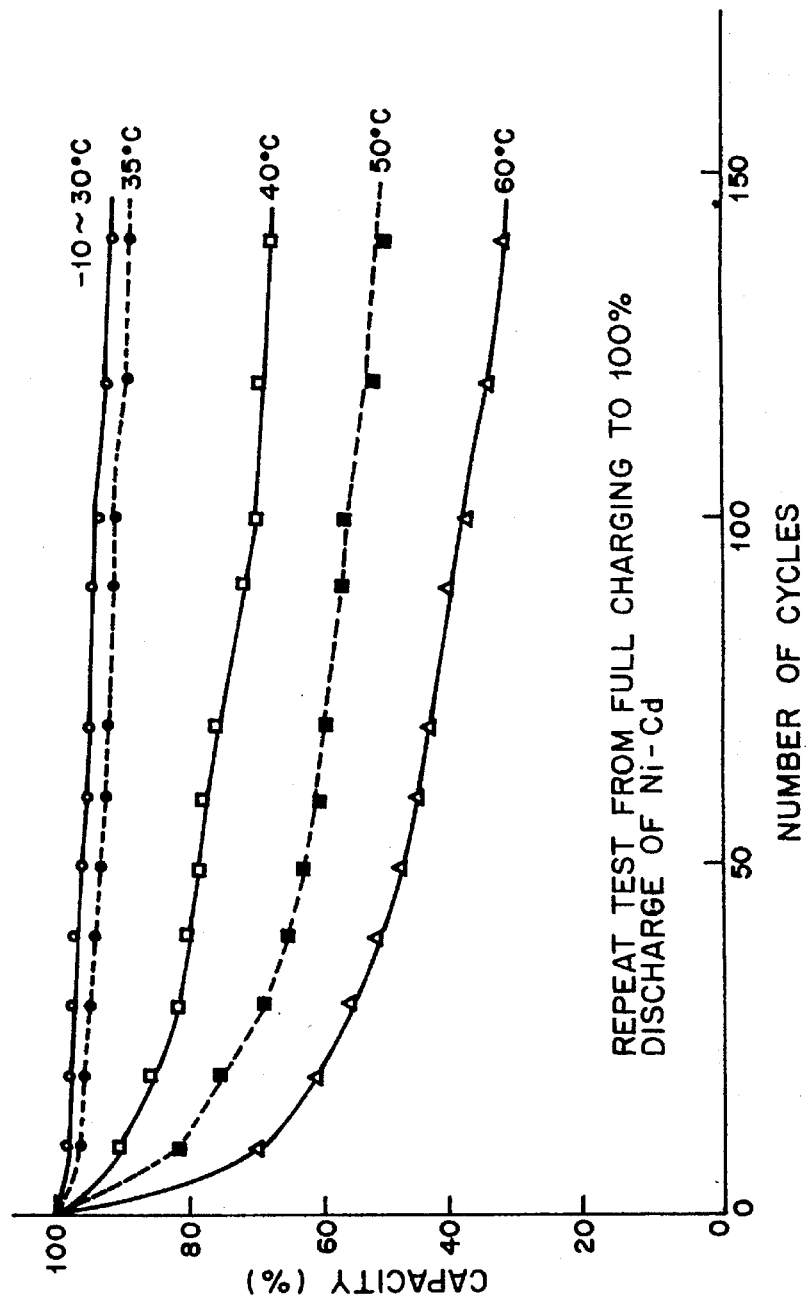
FIG. 4 a diagram showing deteriorations of a battery in full charge-time capacity as a function of the number of charge-discharge cycles at different temperatures.

Importantly, this battery deterioration also becomes severer with the battery temperature as illustrated in FIG. 4. The battery undergoes substantial deterioration especially when the temperature of the battery is high at the time of charging. In FIG. 4, numbers of discharge-charge cycles are plotted along the axis of abscissas. When the battery is fully charged subsequent to a discharge, the battery is defined to have been subjected to one discharge-charge cycle. Although the deterioration characteristic of a battery by such discharge-charge cycles varies depending on the type of the battery, it is possible to detect in advance the deterioration characteristic of the battery by an experiment or the like.

Accordingly, the deterioration-based correction means 11E can correct the full-charge-time capacity $Q_{max}$ in accordance with deterioration of the battery by estimating the quantity of full-charging-time battery deterioration (deterioration-based correction amount) $q(T_B)$ or a full-charging-time battery deterioration rate $q_r$ for the temperature of the battery per every discharge/charge cycle on the basis of detection information from the full charge detection means 11A, detection information from the temperature sensor 14 and the battery deterioration characteristic stored in advance for the corresponding discharge-charge cycle and then subtracting the deterioration-based correction amount $q(T_B)$ from the capacity $Q_{max}$ at the time of the preceding full charge or multiplying the capacity $Q_{max}$ at the time of the preceding full charge with the deterioration rate $q_r$.

Once the deterioration characteristic of the battery is detected in advance as described above, the detection of a battery temperature $T_B$ in a given discharge-charge cycle N makes it possible to estimate the deterioration quantity $q_N(T_B)$ or the deterioration rate $q_{rN}(T_B)$ of a fully-charged capacity $Q_N$ in the current discharge-charge cycle N relative to a fully-charged capacity $Q_{N-1}$ in the preceding discharge-charge cycle N−1 [$q_N(T_B)=Q_{N-1}-Q_N$; or $q_{rN}(T_B)=Q_N/Q_{N-1}$].

By providing, for example, a two-dimensional map, which is useful in obtaining such deterioration quantities (cycle-deterioration-based correction amount) $q_N(T_B)$ or deterioration rates (cycle-deterioration-based correction rate) $q_{rN}(T_B)$ relative to discharge-charge cycles N and battery temperatures $T_B$, and storing the two-dimensional map, the deterioration-based correction means 11E can easily determine the deterioration quantity $q_N(T_B)$ or the deterioration rate $q_{rN}(T_B)$ corresponding to a given discharge-charge cycle N and a given battery temperature $T_B$, thereby making it possible to perform correction in view of deterioration caused upon full charging.

An output signal corresponding to the value of the remaining capacity Q estimated at the controller 11 is then fed to the display unit 20 of the remaining capacity meter and also to the power generation controller 7. The power generation controller 7 outputs such a command signal as operating the alternator 6 when the remaining capacity Q so estimated has become smaller than a preset lower limit but outputs such a command signal as stopping the alternator 6 when the remaining capacity Q has become greater than a preset upper limit.

The display unit 20 of the remaining capacity meter is accommodated, for example, in a combination meter installed inside a vehicle room. As is illustrated in FIG. 1, the display unit 20 comprises the LED 20A which is of the multisegment type, so that the remaining capacity is displayed in the form of a bar graph. In the illustrated embodiment, several lower segments in the LED 20A emit red light whereas the remaining segments located above the lower segments emit blue light. From the lowermost segment to a segment located at a height corresponding to the magnitude of an estimated capacity, the LED segments are continuously lit. The display unit 20 is designed so that the lowermost segment alone is lit even when the value of the remaining capacity is 0 and, as the remaining capacity increases, the segments are lit one by one upwardly. When the capacity is at the maximum (100%), all the segments are lit and, as the capacity decrease conversely, the segments are turned off one by one downwardly. The automotive vehicle can be driven while one or more green segments are lit. When the remaining capacity has decreased to such a level as only the red segments are lit, charging is needed. As is appreciated from the foregoing, the driver can ascertain the remaining capacity by observing the height of lit segments and, depending on the color of the segments so lit, can also determine whether he can drive further or he has to charge the main battery.

Incidentally, the display unit 20 in the illustrated embodiment is normally kept emitting light to indicate the remaining capacity. By causing appropriate segment(s) to flicker, however, it is possible to produce various alarms. By causing, for example, the uppermost and lowermost segments to flicker, it is possible to advise that the main battery has deteriorated increasingly. By causing, for example, all the segments to flicker, it is possible to advise that a certain trouble has occurred in the main battery system.

Figure 3:
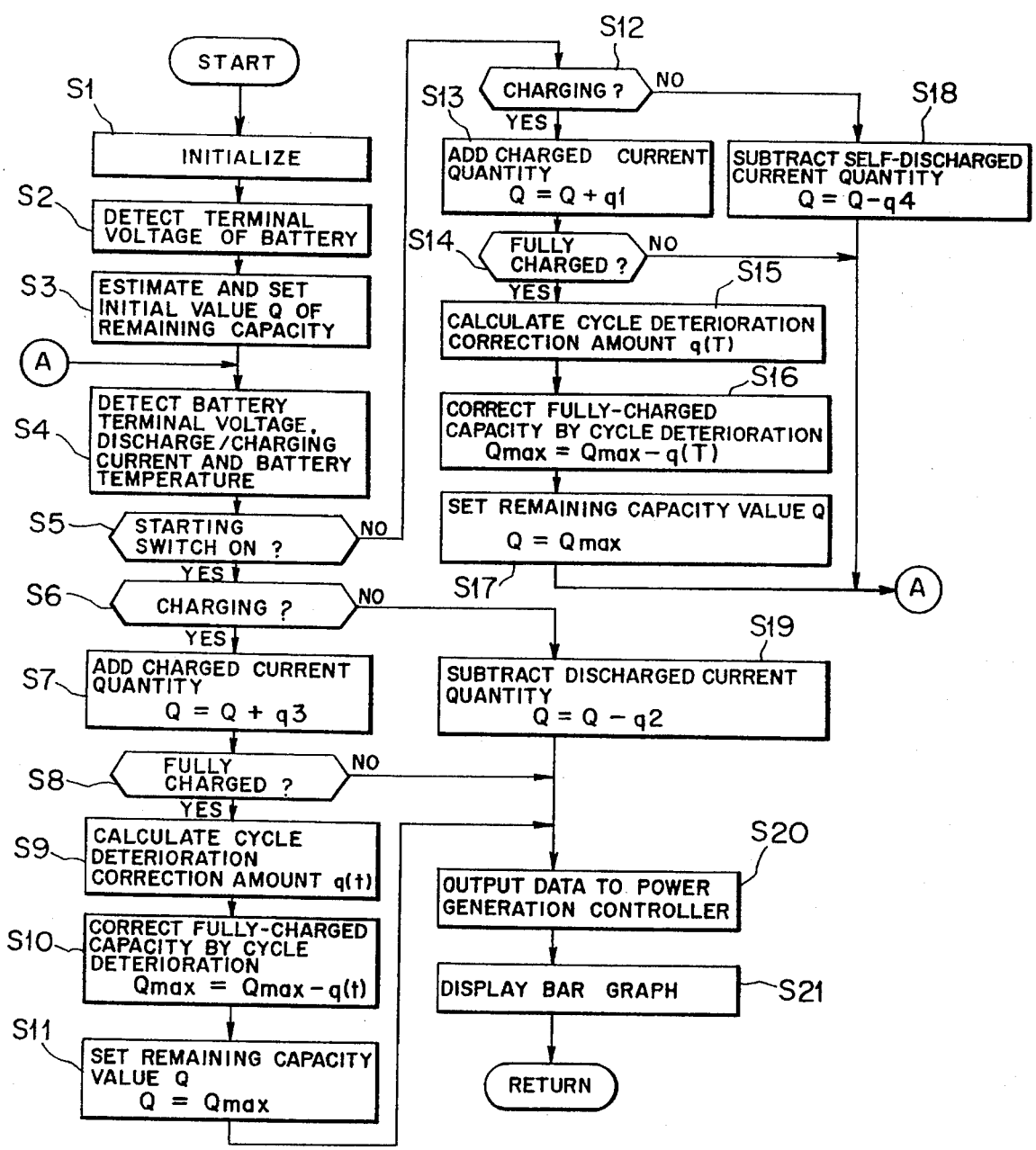
FIG. 3 is a flow chart showing a routine for the calculation of the remaining capacity of the electric vehicle battery by the remaining capacity member according to the embodiment of the present invention.

As the remaining capacity meter according to the one embodiment of the present invention for the electric vehicle battery is constructed as described above, the remaining capacity of the battery is calculated and displayed, for example, by such procedures as shown in FIG. 3.

Namely, as is illustrated in FIG. 3, the remaining capacity and individual data are initialized first and the timer 15 is also reset (step S1). This initialization is performed when the main battery is mounted on the vehicle and connected to a drive circuit of the vehicle. Described specifically, the routine is started upon connection of the main battery 2 to the drive circuit of the vehicle because the controller 11 uses as its power source the main battery 2. There is no data with respect to the remaining capacity of the battery at the time of the start, so that 0 is first set as the value of the remaining capacity at the starting time.

Concurrently with the start, the open terminal voltage of the main battery is measured across the open terminals of the main battery 2 (step S2) and, at the controller 11, the remaining capacity of the main battery 2 is estimated based on a signal indicative of the voltage of the main battery (i.e., an open terminal voltage signal) (step S3).

At the controller 11, the remaining capacity is periodically updated while repeating the operations of step S4 et seq. by using the so-estimated remaining capacity Q as an initial value. Namely, by the voltage sensor 13, the current sensor 12 and the temperature sensor 14, an open terminal voltage, a charging/discharge current and a battery temperature are detected (step S4). It is next determined whether the vehicle starting switch 16 is "ON" (step S5).

If the starting switch 16 is not "ON" the motor 1 is out of operation. The routine then advances to step S12, where it is determined whether the battery is being charged. The charging in this case is generally charging by an external charger.

If the battery is determined to be under charging, a temperature-based correction coefficient $kt_2$ and a charging-efficiency-based correction coefficient kchg are determined from the formulas (4) and (6), respectively. As is appreciated from the formula (7), a charged current quantity $q_1$ obtained from a charging current $i_2$ is corrected by the temperature-based correction coefficient $kt_2$ and the charging-efficiency-based correction coefficient kchg and the charged current quantity so corrected is added to the remaining capacity Q (step S13).

Further, it is also determined by the full charge detection means 11A whether the battery has been fully charged (step S14). Unless the battery has been fully charged, the remaining capacity Q set in step S13 is used as the remaining capacity Q in the control cycle.

If the battery is determined to be in a fully charged state, the routine then advances to step 15, where a cycle-deterioration-based correction amount q(TB) is calculated based on the number of cycles and the battery temperature. In step S16, this cycle-deterioration-based correction amount $q(T_B)$ is subtracted from a full-charge capacity $Q_{max}$ achieved by the preceding charging to obtain a full-charge capacity $Q_{max}$ achieved by the current full charging. As the remaining capacity Q, the full-charge capacity $Q_{max}$ achieved by the current charging is set (step S17). It is possible to conduct the above correction by a cycle-deterioration-based correction rate $q_r(T_B)$. Further, the cycle-deterioration-based correction amount $q_N(T_B)$ or the cycle-deterioration-based correction rate $q_{rN}(T_B)$ can be determined in accordance with a two-dimensional map of cycle numbers and battery temperatures.

If the battery is not determined to be under charging, the self-discharge-based correction is effected by estimating a self-discharged quantity $q_4$ and then subtracting it from the remaining capacity Q (step S18). The estimation of the self-discharged quantity $q_4$ is performed based on a battery temperature T detected by the temperature sensor 14 and a battery left-over time t counted by the timer 15.

If the starting switch 16 is "ON", on the other hand, the motor 1 is in operation so that the routine advances to step S6, where it is determined whether the battery is being charged (step S6). The charging in this case is charging by the alternator mounted on the vehicle.

If the battery is determined to be under charging, a temperature-based correction coefficient $kt_2$ and a charging-efficiency-based correction coefficient kchg are determined from the formulas (4) and (6), respectively. As is appreciated from the formula (8), a charged current quantity $q_3$ obtained from a charging current $i_2$ is corrected by the temperature-based correction coefficient $kt_2$ and the charging-efficiency-based correction coefficient kchg and the charged current quantity so corrected is added to the remaining capacity Q (step S7).

Further, it is also determined by the full charge detection means 11A whether the battery has been fully charged (step S8). Unless the battery has been fully charged, the remaining capacity Q set in step S7 is used as the remaining capacity Q in this control cycle and a corresponding signal is outputted to the power generation controller 7 (step S20), and a bar graph display signal is outputted to the display unit 20 (step 21).

If the battery is determined to be in a fully charged state, the routine then advances from step 8 to step 9, where a cycle-deterioration-based correction amount $q(T_B)$ is calculated based on the number of cycles and the battery temperature. In step S10, this cycle-deterioration-based correction amount $q(T_B)$ is subtracted from a full-charge capacity $Q_{max}$ achieved by the preceding charging to obtain a full-charge capacity $Q_{max}$ achieved by the current full charging. It is possible to conduct the above correction by a cycledeterioration-based correction rate $q_r(T_B)$. Further, the cycle-deterioration-based correction amount $q_N(T_B)$ or the cycle-deterioration-based correction rate $q_{rN}(T_B)$ can be determined in accordance with a two-dimensional map of cycle numbers and battery temperatures.

As the remaining capacity Q, the full-charge capacity $Q_{max}$ achieved by the current charging is set (step S11). A signal corresponding to the remaining capacity Q is then outputted to the power generation controller 7 (step S20), and a bar graph display signal is outputted to the display unit 20 (step 21).

Unless the battery is under charging, it is being discharged. The routine then advances from step S6 to step S19, where a temperature-based correction coefficient $kt_1$ is determined in accordance with the formula (3). A discharged current quantity $q_2$, which has been obtained from a discharged current $i_1$ detected by the current sensor 12, is corrected by the temperature-based correction coefficient $kt_1$ as indicated by the formula (5) and the discharged current quantity so corrected is subtracted from the remaining capacity Q, so that the remaining capacity Q has been subjected to subtractive correction by the current quantity consumed for driving the motor 1. A signal corresponding to the remaining capacity Q so obtained is then outputted to the power generation controller 7 (step S20), and a bar graph display signal is outputted to the display unit 20 (step 21).

When the starting switch 16 is "OFF" in the illustrated embodiment, the routine returns from steps S17,S18 to step S24 so that the remaining capacity is not displayed. As indicated by a two-dot chain line in FIG. 3, however, the routine may be altered to advance from steps S17,S18 to step S20 so that the remaining capacity is displayed.

It is therefore possible to adequately estimate, especially, the deterioration of the battery through charge-discharge cycles while taking into consideration the temperature of the battery as described above. This has made it possible to set at an appropriate value the full-charge-time remaining capacity Q which is used as a basis and hence to always determine the remaining capacity Q of the main battery 2 accurately.

As a consequence, the remaining capacity of the main battery 2 can be adequately displayed. Based on the residual capacity Q so displayed, the driver can appropriately determine whether he can drive the vehicle further or he should charge the main battery. In the case of a series hybrid electric vehicle with an alternator mounted thereon like the electric vehicle of the embodiment, operation or stop of the alternator can be controlled adequately.

Depending on the characteristics and/or use environment of the battery, it is possible to contemplate of omitting the temperature-based correction upon charging or discharging and/or the charging-efficiency-based correction upon charging.

Although the nickel-cadmium battery is employed as the main battery 2 in the embodiment, the battery to which the present remaining capacity meter for electric vehicle battery can be applied is not limited to such a nickel-cadmium battery. Adoption of the present remaining battery capacity meter for a battery whose deterioration through charge-discharge cycles varies depending on the temperature can bring about the advantage that the residual capacity can be accurately determined as in the above embodiment.

What is claimed is:

1. A remaining capacity meter for an electric vehicle battery, said meter being suited for use in the detection of a remaining capacity of the electric vehicle battery, comprising:

full charge detection means for detecting whether said battery has been brought into a fully-charged state;

remaining capacity setting means for setting, as a full-charge-time capacity, the remaining capacity of said battery at the time of detection of the fully-charged state by the full charge detection means;

discharge/charge-based correction means for correcting the remaining capacity, which has been set by said remaining capacity setting means, while integrating, with respect to time, a current discharged from or charged into said battery; and deterioration-based correction means for correcting the fully-charged capacity, which has been set by said remaining capacity setting means, by a deterioration-based correction quantity corresponding to the number of chargings and battery temperatures at the time of the respective chargings.

2. A remaining capacity meter according to claim 1, wherein said remaining capacity setting means sets an initial value of said remaining capacity on the basis of a terminal voltage of said battery.

3. A remaining capacity meter according to claim 1, further comprising self-discharge-based correction means for predicting a self-discharged quantity of said battery from a battery left-over time and a battery temperature at the time of the left-over of said battery while said electric vehicle is out of operation and then correcting the remaining capacity by the self-discharged quantity.

4. A remaining capacity meter according to claim 1, wherein said discharge/charge-based correction means corrects the integral of the current discharged from or charged into said battery in accordance with the temperatures of said battery at the time of the respective chargings or dischargings.

5. A remaining capacity meter according to claim 1, wherein said discharge/charged-based correction means corrects the integral of the current charged into said battery in accordance with the charging rates at the time of respective chargings.

6. A remaining capacity meter according to claim 1, further comprising means for displaying the remaining capacity obtained as a result of the corrections by said deterioration-based correction means and said charge/discharge-based correction means subsequent to the setting thereof by said remaining capacity setting means.

7. A remaining capacity detection method for an electric vehicle battery, said method being useful for the detection of a remaining capacity of said electric vehicle battery, comprising the following steps:

detecting whether said battery has been brought into a fully-charged state;

setting a full-charge-time capacity, which has been obtained by correcting an initial full-charge-time capacity of said battery by a deterioration-based correction amount corresponding to the number of chargings of said battery and the battery temperatures at the time of the respective chargings, as the remaining capacity of said battery when said battery has been brought into the fully-charged state; and correcting the remaining capacity, which has been set in the remaining capacity setting step, while integrating, with respect to time, a current discharged from or charged into said battery.

8. A remaining capacity detection method according to claim 7, wherein in the remaining capacity setting step, the initial full-charge-time capacity is set based on a terminal voltage of said battery at the time of a start.

9. A remaining capacity detection method according to claim 7, further comprising the following step:

predicting a self-discharged quantity of said battery from a battery left-over time and a battery temperature at the time of the left-over of said battery while said electric vehicle is out of operation and then correcting by the self-discharged quantity the remaining capacity set in the remaining capacity setting step.

10. A remaining capacity detection method according to claim 7, wherein in the discharge/charge-based correction step, the integral of the current discharged from and/or charged into said battery is corrected in accordance with the temperatures of said battery at the time of the respective chargings and/or dischargings.

11. A remaining capacity detection method according to claim 7, wherein in the discharge/charge-based correction step, the integral of the current charged into said battery is corrected in accordance with the charging rates at the time of respective chargings.

\* \* \* \* \*